(12) United States Patent
Li et al.

(10) Patent No.: US 12,178,092 B2
(45) Date of Patent: Dec. 24, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Yanyang Li, Hubei (CN); Shaojing Wu, Hubei (CN); Xiaoguang Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 338 days.

(21) Appl. No.: 17/623,997

(22) PCT Filed: Dec. 17, 2021

(86) PCT No.: PCT/CN2021/139147
§ 371 (c)(1),
(2) Date: Dec. 30, 2021

(87) PCT Pub. No.: WO2023/103037
PCT Pub. Date: Jun. 15, 2023

(65) Prior Publication Data
US 2023/0180549 A1    Jun. 8, 2023

(30) Foreign Application Priority Data

Dec. 8, 2021 (CN) .......................... 202111494060.X

(51) Int. Cl.
*H10K 59/131* (2023.01)
*G09G 3/3208* (2016.01)
(Continued)

(52) U.S. Cl.
CPC ......... *H10K 59/131* (2023.02); *H10K 59/126* (2023.02)

(58) Field of Classification Search
CPC ............... H10K 59/131; H10K 59/126; G09G 2300/0426; G09G 2320/0209;
(Continued)

(56) References Cited

U.S. PATENT DOCUMENTS

2018/0331124 A1* 11/2018 Cho ..................... H10K 59/126

FOREIGN PATENT DOCUMENTS

CN        104252068 A    12/2014
CN        105404036 A     3/2016
(Continued)

*Primary Examiner* — Sonya McCall-Shepard
(74) *Attorney, Agent, or Firm* — Rivka Friedman

(57) ABSTRACT

The present application provides a display panel. The display panel includes a plurality of data lines, a plurality of constant voltage traces, and a plurality of drive traces located in a display area. The display panel further includes a first metal layer, a second metal layer, and a shield layer between the first metal layer and the second metal layer, wherein the first metal layer includes a gate trace, the shield layer includes a plurality of shield traces, and the second metal layer includes the drive trace. An overlap region of the drive trace and the gate trace on the shield layer overlaps with the shield trace.

20 Claims, 8 Drawing Sheets

(51) Int. Cl.
*H01L 27/12* (2006.01)
*H10K 59/126* (2023.01)

(58) Field of Classification Search
CPC ......... G09G 3/3208; G09G 2300/0408; G09G 3/30–3233; G09G 3/3233–3291; G09G 2300/0421; H01L 27/124
See application file for complete search history.

(56) References Cited

FOREIGN PATENT DOCUMENTS

| | | | |
|---|---|---|---|
| CN | 106952940 | A | 7/2017 |
| CN | 108254984 | A | 7/2018 |
| CN | 111146261 | A | 5/2020 |
| CN | 111653197 | A | 9/2020 |
| CN | 112271205 | A | 1/2021 |
| CN | 112764284 | A | 5/2021 |
| CN | 112786670 | A | 5/2021 |
| CN | 113031352 | A | 6/2021 |
| CN | 214476185 | U | 10/2021 |
| JP | 2002049330 | A | 2/2002 |
| WO | 2021227758 | A1 | 11/2021 |

* cited by examiner

DISPLAY PANEL

This application claims priority to Chinese Patent Application No. 202111494060.X, filed with the Chinese Patent Office on Dec. 8, 2021, and entitled "DISPLAY PANEL", the entire content of which is incorporated herein by reference.

TECHNICAL FIELD

The present application relates to a field of display technology, and in particular to a display panel.

BACKGROUND

With the increasing proportion of the display area of the OLED (Organic Light-emitting Diode) display panel and the market demand for the irregular bezel, the wiring space at the edge of the display panel is challenged. The portion of the display panel that occupies a relatively large proportion of the edge space is a portion where the signal line from the drive chip enters the display area, and the line is generally fan-shaped, also referred to as a fan-out trace. In order to adapt to the present situation that the edges of the display panel gradually decrease, a design scheme is proposed in which the fan-out traces are arranged in the display area, and the design scheme gradually becomes a key technology for compressing the edges of the display panel. However, since the fan-out traces serve as a channel for the drive chip to transmit signals to the display area, the electrical signals present in the fan-out traces interfere with the signals in the gate traces connected to the drive transistors in the display area, resulting in abnormal display of the display panel.

Technical Problems

The present display panel has a technical problem that the fan-out traces located in the display area interfere with the signal transmitted by the gate traces.

SUMMARY

The present application provides a display panel for alleviating a technical problem that a fan-out trace located in the display area of the display panel interferes with the signal transmitted by a gate trace.

A display panel including a display area and a non-display area adjacent to the display area, wherein the display panel includes:
  a substrate;
  a drive circuit layer disposed on the substrate, the drive circuit layer includes a plurality of data lines and a plurality of constant voltage traces located in the display area, and a plurality of drive traces located at least partially in the display area and electrically connected to the data lines and the drive chip;
  the drive circuit layer includes a first metal layer, a second metal layer, and a shield layer between the first metal layer and the second metal layer, the first metal layer includes a plurality of gate traces, the shield layer includes a plurality of shield traces electrically connected to the constant voltage traces, the second metal layer includes the drive traces, and an overlap region of at least a portion of an orthographic projection of the drive trace on the shield layer and an orthographic projection of at least a portion of the gate trace on the shield layer overlaps with the shield trace.

In the display panel of the present application, an orthographic projection of at least a portion of the drive trace on the shield layer overlaps with the shield trace, and an orthographic projection of at least a portion of the gate trace on the shield layer overlaps with the shield trace.

In the display panel of the present application, the orthographic projection of the drive trace on the shield layer overlaps with the shield trace.

In the display panel of the present application, the display panel includes a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel.

In the display panel of the present application, the display panel includes a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel and the second sub-pixel.

In the display panel of the present application, the driving circuit layer further includes a third metal layer disposed between the first metal layer and the shield layer, the third metal layer includes the data line, the constant voltage trace, and a gate connection line electrically connected to the gate trace, the shield trace covers at least an overlap region of an orthographic projection of the data line, the constant voltage trace, and the gate connection line on the shield layer and the orthographic projection of the drive trace on the shield layer.

In the display panel of the present application, a connection point of the drive trace and the data line is located in the display area.

In the display panel of the present application, a number of connection points of each drive trace and the data line is one or more.

In the display panel of the present application, an end of the drive trace terminates at the connection point of the drive trace and the data line.

In the display panel of the present application, the display panel further includes a fourth metal layer located on a side of the second metal layer away from the shield layer, the fourth metal layer includes a plurality of shield traces located in the display region;
  the display area includes a first display area provided with the drive trace and a second display area adjacent to the first display area;
  a distribution shape of the shield traces in the first display area is the same as a distribution shape of the shield traces in the second display area, and an orthographic projection of the drive trace in the display area on the fourth metal layer overlaps with the shield trace.

In the display panel of the present application, a distribution shape of a layout of the shelter traces in the fourth metal layer is the same as a distribution shape of the drive traces in the second metal layer.

In the display panel of the present application, the shield trace is closer to a light-emitting side of the display panel than the drive trace.

In the display panel of the present application, the display panel further includes a fourth metal layer located on a side of the second metal layer away from the shield layer, the fourth metal layer comprises a plurality of shelter traces located in the display area;

the second metal layer includes a plurality of virtual traces electrically insulated from the drive traces and the drive chip, the display panel includes a plurality of sub-pixels, the virtual traces in two adjacent sub-pixels are disconnected from each other, and an orthographic projection of the shelter trace on the second metal layer covers at least a portion of a disconnection region of the virtual traces in two adjacent sub-pixels.

In the display panel of the present application, the plurality of virtual traces includes a first virtual trace extending in a first direction and a second virtual trace extending in a second direction;

an orthographic projection of the shelter trace on the second metal layer covers a disconnection region of the first virtual traces in two adjacent sub-pixels.

In the display panel of the present application, the orthographic projection of the shelter trace on the second metal layer covers a disconnection region of the second virtual traces in two adjacent sub-pixels.

In the display panel of the present application, an orthographic projection of the drive trace on the fourth metal layer overlaps with the shield trace, and an orthographic projection of the virtual trace on the fourth metal layer overlaps with the shield trace.

In the display panel of the present application, the display area includes a first display area provided with the drive trace, and a second display area adjacent to the first display area; a distribution shape of the shelter trace in the first display area is the same as a distribution shape of the shelter trace in the second display area.

In the display panel of the present application, the shield trace is electrically connected to the constant voltage trace.

The present application further provides a display panel including a display area and a non-display area adjacent to the display area, the display panel including:

a substrate;

a drive circuit layer disposed on the substrate, the drive circuit layer comprises a plurality of data lines and a plurality of constant voltage traces located in the display area, and a plurality of drive traces located at least partially in the display area and electrically connected to the data lines and the drive chip;

The drive circuit layer includes a first metal layer, a second metal layer, and a shield layer between the first metal layer and the second metal layer, the first metal layer comprises a plurality of gate traces, the shield layer comprises a plurality of shield traces electrically connected to the constant voltage traces, the second metal layer comprises the drive traces;

the display panel includes a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel, and an orthographic projection of the drive trace on the shield layer overlaps with the shield trace.

Beneficial Effects

The present application provides a display panel including a drive circuit layer, wherein the drive circuit layer includes a plurality of data lines and a plurality of constant voltage traces located in a display area, and a plurality of drive traces electrically connected to the data lines and a drive chip. The drive circuit layer includes a first metal layer, a second metal layer, and a shield layer between the first metal layer and the second metal layer, the first metal layer includes a plurality of gate traces, the shield layer includes a plurality of shield traces electrically connected to the constant voltage traces, the second metal layer includes the drive traces, and an overlap region where an orthographic projection of at least a portion of the drive traces on the shield layer and an orthographic projection of at least a portion of the gate traces on the shield layer are overlapped overlaps with the shield traces. In the present application, the shield trace is provided between the drive trace and the gate trace, the shield trace is electrically connected to the constant voltage trace, and the signal between the drive trace and the gate trace is shielded by the shield trace, thereby weakening or eliminating interference of the signal in the drive trace on the signal in the gate trace, and improving the display quality of the display panel.

BRIEF DESCRIPTION OF THE DRAWINGS

In order to more clearly illustrate the embodiments or prior art solutions, the accompanying drawings required for use in the description of the embodiments or prior art will be briefly described below. It will be apparent that the accompanying drawings in the following description are merely some of the embodiments of the application, and other drawings may be obtained from these drawings without creative effort by one of ordinary skill in the art.

DETAILED DESCRIPTION OF THE EMBODIMENTS

Figure 1:
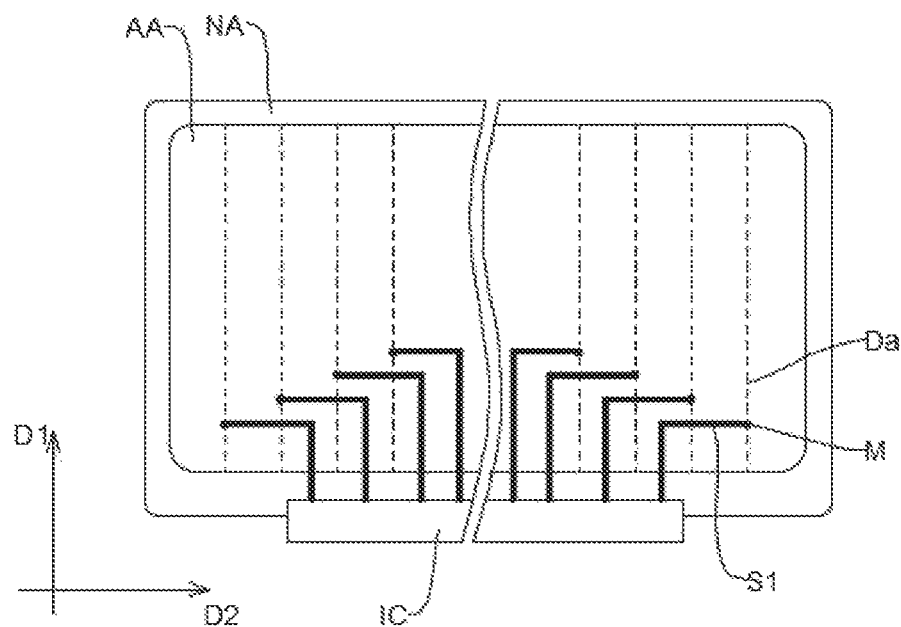
FIG. 1 is a schematic diagram of a wiring structure of a data line and a drive trace in a display panel according to an embodiment of the present application.

The following embodiments are described with reference to additional illustrations to illustrate specific embodiments that may be implemented by the present application. The direction terms mentioned in the present application, such as [upper], [lower], [front], [rear], [left], [right], [inner], [outer], [side], and the like, refer only to the directions of the additional drawings. Therefore, the direction terms used are intended to illustrate and understand the present application and are not intended to limit the present application. In the figure, elements of similar structure are denoted by the same reference numerals.

An embodiment of the present application provides a display panel including a drive circuit layer, wherein the drive circuit layer includes a plurality of data lines and a plurality of constant voltage traces located in a display area, and a plurality of drive traces at least partly located in the display area and electrically connected to the data lines and a drive chip. The drive circuit layer includes a first metal layer, a second metal layer, and a shield layer between the first metal layer and the second metal layer, the first metal layer includes a plurality of gate traces, the shield layer includes a plurality of shield traces electrically connected to the constant voltage traces, the second metal layer includes the drive traces, and an overlap region where an orthographic projection of at least a portion of the drive traces on the shield layer and an orthographic projection of at least a portion of the gate traces on the shield layer are overlapped overlaps with the shield traces. In the present application, the shield trace is provided between the drive trace and the gate trace, the shield trace is electrically connected to the constant voltage trace, and the signal between the drive trace and the gate trace is shielded by the shield trace, thereby weakening or eliminating interference of the signal in the drive trace to the signal in the gate trace, thereby improving the display quality of the display panel.

The structural and functional features of a display panel provided by an embodiment of the present application will be described below with reference to the accompanying drawings.

Referring to FIG. 1, FIG. 1 is a schematic diagram of a wiring structure of a data line and a drive trace in a display panel according to an embodiment of the present application. The display panel has a display area AA, and a non-display area NA adjacent to the display area AA. The display panel is provided with a plurality of sub-pixels achieving a display function, such as a red sub-pixel, a green sub-pixel, a blue sub-pixel, and the like, in the display area AA, and each of sub-pixels has a specific shape and distribution area. It is understood that the display area AA of the display panel is composed of a plurality of the sub-pixels combined according to a certain distribution rule, and the display function of the display panel is implemented under coordinated emission of the plurality of the sub-pixels. The display panel is provided with a plurality of elements supporting the display function in the non-display area NA, such as a drive chip IC for supplying a data drive signal to a sub-pixel in the display area AA.

The display area AA of the display panel is provided with a plurality of data lines Da and a plurality of drive traces S1 electrically connected to the data lines Da. The data lines Da extend in the display area AA along a first direction D1 and are arranged in a second direction D2, wherein the first direction D1 and the second direction D2 may be perpendicular to each other. Each of the data lines Da corresponds to a column of sub-pixels in the display panel, and provides a data signal for the column of sub-pixels. The drive trace S1 is located at least partially in the display area AA, and opposite ends of the drive trace S1 are electrically connected to the data line Da and the drive chip IC, respectively. Each of the drive traces S1 is electrically connected to one of the data lines Da. The drive chip IC is located in a non-display area NA of the display panel, and provides a data signal to the data lines Da through the drive traces S1 to control a display function of the display panel. It will be understood that the arrangement of the drive traces S1 for connecting the drive chip IC and the data lines Da in the display area AA can reduce the space occupied by the drive traces S1 for the non-display area NA, facilitate the reduction of the edge width of the display panel, and realize the narrow bezel design.

Alternatively, the number of connection points M between each of the drive traces S1 and the data lines Da may be one or more. When the number of the connection points M is 1, one end of the drive trace S1 may terminate at the connection point M. When the number of the connection points M is plural, the drive trace S1 continues to extend a distance along the data line Da from the first connection point M with the data line Da, and more connection points M with the data line Da are provided at the extension portion.

Figure 2:
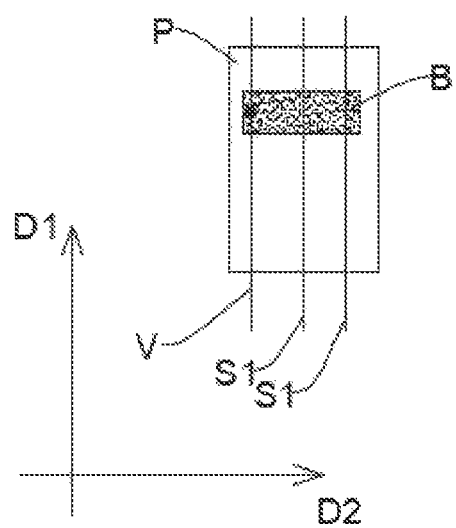
FIG. 2 is a partial schematic diagram of an area where one sub-pixel in the display panel shown in FIG. 1 is located.
Figure 3:
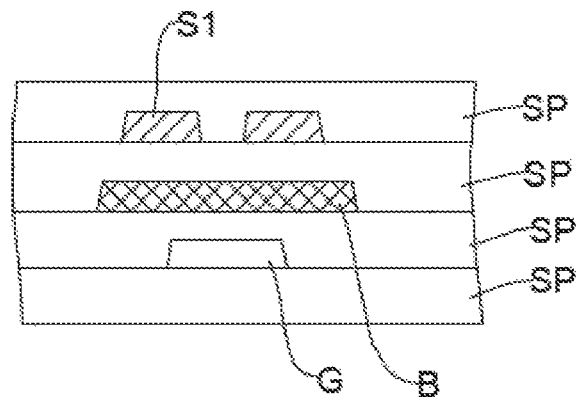
FIG. 3 is a partial sectional view corresponding to the sub-pixel shown in FIG. 2.
Figure 4:
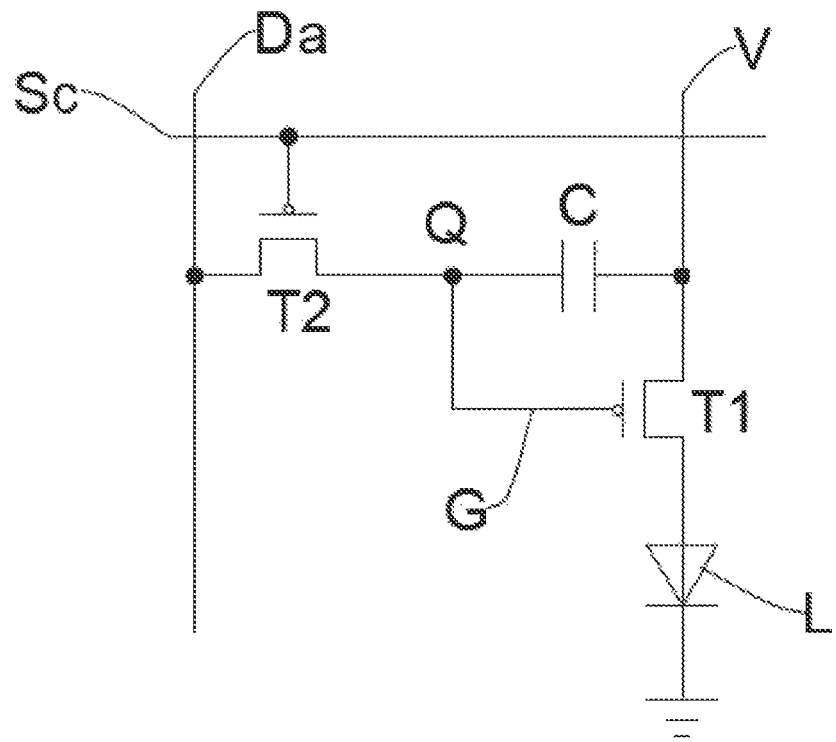
FIG. 4 is a pixel circuit schematic diagram of one sub-pixel in a display panel according to an embodiment of the present application.

Referring further to FIG. 2, FIG. 3, and FIG. 4, FIG. 2 is a partial schematic view of an area where a sub-pixel in the display panel shown in FIG. 1 is located, FIG. 3 is a partial sectional view corresponding to the sub-pixel shown in FIG. 2, and FIG. 4 is a pixel circuit schematic diagram of one sub-pixel in the display panel provided in this embodiment. A large number of sub-pixels P shown in FIG. 2 are distributed in the display area AA of the display panel. Although two of the drive traces S1 are distributed in a range of the single sub-pixel P shown in FIG. 2, it is not limited thereto that a larger or smaller number of drive traces S1 or no drive traces S1 may be distributed in other sub-pixels P of the display panel.

A plurality of constant voltage traces V, a plurality of scan lines Sc, and a plurality of gate traces G are also provided in the display area AA of the display panel. The constant voltage trace V provides a specific voltage within the constant voltage trace V to meet voltage requirements of a portion of the traces and the light-emitting elements in the display panel. The scan line Sc is used to provide a scanning signal to adjust the timing of light emission display of each sub-pixel P. The gate trace G is connected to the driving transistor T1 in the pixel circuit to control the operation state of the driving transistor T1.

Specifically, a first metal layer, a second metal layer, and a shield layer between the first metal layer and the second metal layer are disposed in a film layer structure of the display panel, the gate traces G are disposed in the first metal layer, and the drive traces S1 are disposed in the second metal layer. The display panel further includes shield traces B disposed in the shield layer, and the shield trace B is electrically connected to the constant voltage trace V to ensure a specific voltage on the shield trace B. An insulating layer SP is provided between the first metal layer and the shield layer, between the shield layer and the second metal layer, on a side of the first metal layer away from the shield layer, and on a side of the second metal layer away from the shield layer (referring to FIG. 3).

The shield trace B is disposed at least between the drive trace S1 and the gate trace G, and an overlap region where at least a portion of an orthographic projection of the drive trace S1 on the shield layer and at least a portion of an orthographic projection of the gate trace G on the shield layer are overlapped overlaps with the shield trace B. The shield line B is provided between the drive trace S1 and the gate trace G, and the shield line B is electrically connected to the constant voltage trace V, and the signal between the drive trace S1 and the gate trace G is shielded by the shield trace B, thereby weakening or eliminating interference of the signal in the drive trace S1 to the signal in the gate trace G, thereby improving the display quality of the display panel.

Referring to FIG. 4, the principle of shielding the signal between the drive trace S1 and the gate trace G using the shield trace B will be described below. A driving transistor T1 and a switching transistor T2 are provided in the pixel circuit. A gate and a source of the switching transistor T2 are electrically connected to the scan line Sc and the data line Da, respectively. A source and a drain of the drive transistor T1 are electrically connected to the constant voltage trace V and the light-emitting unit L, respectively. A gate of the driving transistor T1 is electrically connected to a drain of the switching transistor T2 through the gate trace G, and forms a node Q. A capacitor C is electrically connected between the node Q and the source of the drive transistor T1. When the drive traces S1 and the gate traces G are close to each other, the signals of the drive traces S1 and the gate traces G interfere with each other, causing the potential of the node G to change, and further affecting the emission effect of the light-emitting unit L. In the embodiment of the present application, the signal between the drive trace S1 and the gate trace G is shielded by the shield trace B to avoid potential changes at the node Q.

Optionally, the shield trace B is disposed at an intersection of an orthographic projection of the drive trace S1 on the shield layer and an orthographic projection of the gate trace G on the shield layer, so as to shield an area where signal interference between the drive trace S1 and the gate trace G is strongest.

Further, in order to increase a signal shielding effect, it is also possible to further enlarge the coverage area of the shield trace B so that the shield trace B covers an area where the orthographic projection of the drive trace S1 on the shield layer and the orthographic projection of the gate trace G on the shield layer are close to each other, on the basis of the above-described design in which the orthographic projection of the drive trace S1 on the shield layer and the orthographic projection of the gate trace G on the shield layer are intersected.

Further, in order to achieve a better signal shielding effect, the shield traces B may be arranged along an orthographic projection of the drive traces S1 on the shield layer, and the coverage area of the shield traces B on the shield layer may be larger than the orthographic projection of the drive traces S1 on the shield layer, so as to completely shield the signals of the drive traces S1, and prevent the gate traces G and other traces located below the shield layer from being interfered by the signals of the drive traces S1.

The film layer structure of the display panel provided in the embodiment of the present application will be further described with reference to FIG. 5. The display panel includes a substrate 10, a drive circuit layer 20 provided on the substrate 10, a light-emitting layer 30 provided on the drive circuit layer 20, and a package layer 40 provided on the light-emitting layer 30. Alternatively, the substrate 10 may include a substrate layer and a buffer layer disposed on the substrate layer, the substrate layer may be a glass substrate or the like, and the buffer layer may be a composite film layer formed by stacking a polyimide layer, an inorganic layer, and a polyimide layer.

The drive circuit layer 20 includes: a connection trace 201 and a semiconductor layer 202 disposed on the substrate 10, a first gate insulating layer 203 covering the connection trace 201 and the semiconductor layer 202, a first gate trace G1 disposed on the first gate insulating layer 203, a second gate insulating layer 205 covering the first gate trace G1, a second gate trace G2 disposed on the second gate insulating layer 205, an interlayer insulating layer 207 covering the second gate trace G2, a data line Da, a constant voltage trace V, a gate interconnection line 208 and a drain 209 disposed on the interlayer insulating layer 207, a first passivation layer 210 covering the data line Da, the constant voltage trace V, the gate interconnection line 208 and the drain 209, a shield trace B and a first drain interconnection line 211 disposed on the first passivation layer 210, a second passivation layer 212 covering the shielded line B and the first drain interconnection line 211, a drive trace S1 and a second drain interconnection line 213 disposed on the second passivation layer 212, a third passivation layer 214 covering the drive trace S1 and the second drain interconnection line 213, a shelter line Z disposed on the third passivation layer 214, and a flat layer 215 covering the shelter line Z. The data line Da is electrically connected to the connection trace 201, the gate interconnection line 208 is electrically connected to the first gate trace G1, the shield trace B is electrically connected to the constant voltage trace V, and the second drain interconnection line 213, the first drain interconnection line 211, and the drain 209 are electrically connected in sequence. Further, each of the drive traces S1 is electrically connected to one of the data lines Da respectively.

It is understood that any one of the first gate trace G1 and the second gate trace G2 corresponds to the gate trace G described above, and that the metal layer in which the first gate trace G1 or the second gate trace G2 is located corresponds to the first metal layer described above. The metal layer in which the shield trace B is located corresponds to the shield layer described above. The metal layer in which the drive trace S1 is located corresponds to the second metal layer described above. The metal layer in which the data line Da, the constant voltage trace V, and the gate connection line 208 are located is a third metal layer.

Further, it should be noted that in some other embodiments, the shelter trace Z may not be provided in the drive circuit layer 20. The functions, effects and structural features of the shelter traces Z provided in the present embodiment will be described below.

Within the light emitting layer 30, the display panel is provided with a plurality of light-emitting elements, and the display area in which each of the light-emitting elements and the drive circuit connected thereto are located is a sub-pixel area, or referred to as a sub-pixel, such as the above-mentioned sub-pixel P. The light-emitting layer includes: a pixel definition layer 301 disposed on the flat layer 215, an anode 302 disposed on the flat layer 215 and exposed through an opening on the pixel definition layer 301, a light-emitting functional layer 303 disposed in the opening on the pixel definition layer 301 and in contact with the anode 302, a cathode 304 disposed on the pixel definition layer 301 and in contact with the light-emitting functional layer 303, and a support post 305 disposed on the pixel definition layer 301. Wherein the anode is electrically connected to the second drain interconnection line 213. The anode 302, the light-emitting functional layer 303, and the cathode 304 provided corresponding to one opening of the pixel definition layer 301 constitute a light-emitting element, which may be an organic light-emitting diode.

The package layer 40 completely covers the light-emitting layer 30 for sealing and protecting the light-emitting layer 30. The package layer 40 may be a composite structure film layer formed by stacking an organic layer, an inorganic layer, and an organic layer.

In the present embodiment, the shield trace B is disposed between the drive trace S1 and the second gate trace G2, between the drive trace S1 and the data line Da, between the constant voltage trace V and the drive trace S1, and between the gate connection line 208 and the drive trace S1. An overlap area where an orthographic projection of the drive trace S1 on the shield layer and an orthographic projection of the second gate trace G2 on the shield layer are overlapped overlaps with the shield trace B. An overlap area where an orthographic projection of the drive trace S1 on the shield layer and an orthographic projection of the first gate trace G1 on the shield layer are overlapped overlaps with the shield trace B. An overlap area where an orthographic projection of the drive trace S1 on the shield layer and an orthographic projection of the data line Da on the shield layer are overlapped overlaps with the shield trace B. An overlap region where an orthographic projection of the drive trace S1 on the shield layer and an orthographic projection of the constant voltage trace V on the shield layer are overlapped overlaps with the shield trace B. An overlap region where an orthographic projection of the drive trace S1 on the shield layer and an orthographic projection of the gate connection line 208 on the shield layer are overlapped overlaps with the shield trace B. With the above arrangement, it is possible to weaken or eliminate the interference of the signals in the drive trace S1 on the signals in the first gate trace G1, the second gate trace G2, the data line Da, the constant voltage trace V, and the gate connection line 208, thereby improving the display quality of the display panel.

Further, in order to increase the signal shielding effect, the coverage area of the shield trace B may be further enlarged such that the shield trace B covers an area where the orthographic projection of the drive trace S1 on the shield layer and the orthographic projection of the first gate trace G1 on the shield layer are close to each other, the shield trace B covers an area where the orthographic projection of the drive trace S1 on the shield layer and the orthographic projection of the second gate trace G2 on the shield layer are close to each other, the shield trace B covers an area where the orthographic projection of the drive trace S1 on the shield layer and the orthographic projection of the data line Da on the shield layer are close to each other, the shield trace B covers an area where the orthographic projection of the drive trace S1 on the shield layer and the orthographic projection of the constant voltage trace V on the shield layer are close to each other, and the shield trace B covers an area where the orthographic projection of the drive trace S1 on the shield layer and the orthographic projection of the gate connection line 208 on the shield layer are close to each other.

Further, in order to achieve a better signal shielding effect, the shield traces B may be disposed along the orthographic projection of the drive traces S1 on the shield layer, and the coverage area of the shield traces B on the shield layer may be larger than the orthographic projection of the drive trace S1 on the shield layer, so as to completely shield the signals of the drive trace S1, and prevent the first gate trace G1, the second gate trace G2, the data line Da, the constant voltage trace V, and the gate connection line 208 from being interfered by the signals of the drive traces S1.

The distribution characteristics of the shield traces B in the display panel provided in the present embodiment with respect to each sub-pixel will be further described with reference to FIGS. 6 to 9.

Figure 6:
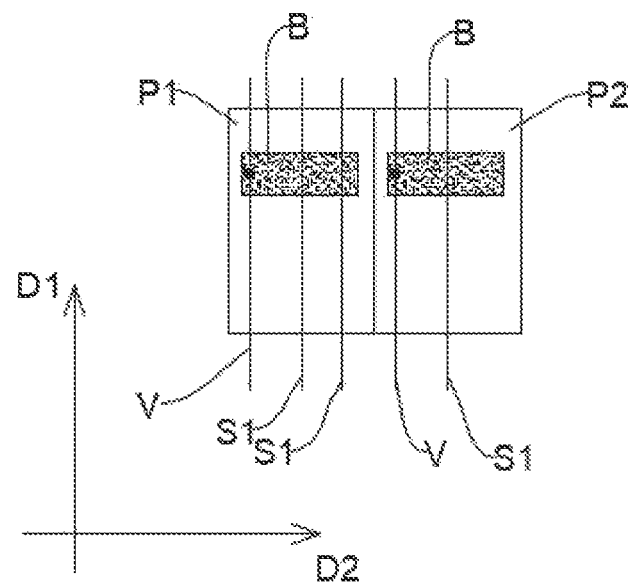
FIG. 6 is a schematic diagram of a first arrangement position of a shield trace according to an embodiment of the present application.
Figure 7:
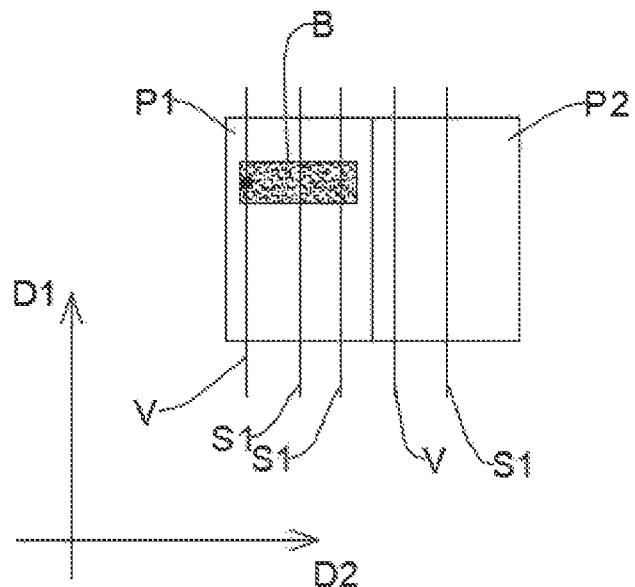
FIG. 7 is a schematic diagram of a second arrangement position of a shield trace according to an embodiment of the present application.

Referring to FIGS. 6 and 7, among the plurality of sub-pixels of the display panel, a first sub-pixel P1 and a second sub-pixel P2 are arranged in a second direction D2. The number of the drive traces S1 included in the first sub-pixel P1 extending in the first direction D1 is greater than the number of the drive traces S1 included in the second sub-pixel P2 extending in the first direction D1. For example, the number of the drive traces S1 included in the first sub-pixel P1 is 2, the number of the drive traces S1 included in the second sub-pixel P2 is 1, and the distribution law repeatedly appear in the area in the display panel provided with the drive traces S1. For such an embodiment, the shield trace B may be disposed simultaneously in the first sub-pixel P1 and the second sub-pixel P2 (for example, as shown in FIG. 6) to achieve signal shielding for each sub-pixel provided with the drive trace S1. The shield trace B may be provided only in the first sub-pixel P1, and the second sub-pixel P2 may not be provided with the shield traces B (for example, as shown in FIG. 7), so that the number of shield traces B may be reduced, and signal shielding may be performed only in sub-pixels including a large number of drive traces S1, thereby balancing the signal shielding effect and the display opening rate.

Figure 8:
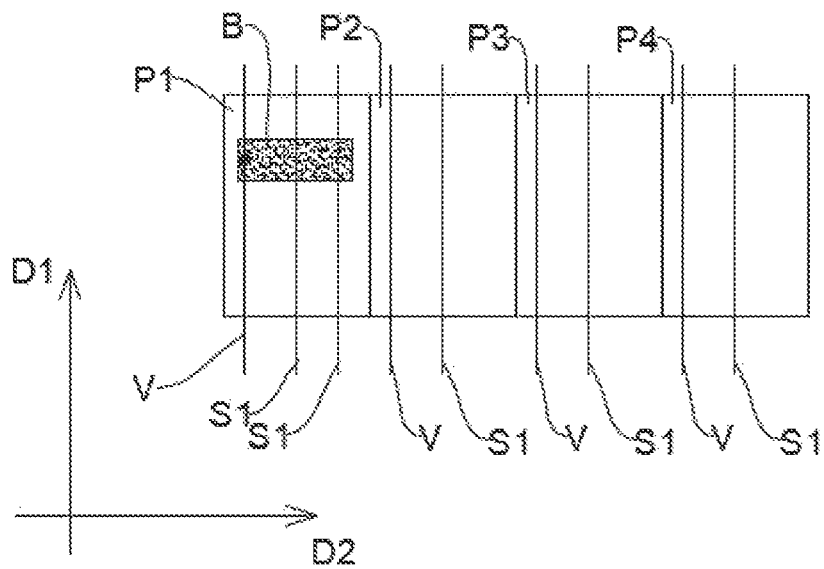
FIG. 8 is a schematic diagram of a third arrangement position of a shield trace according to an embodiment of the present application.
Figure 9:
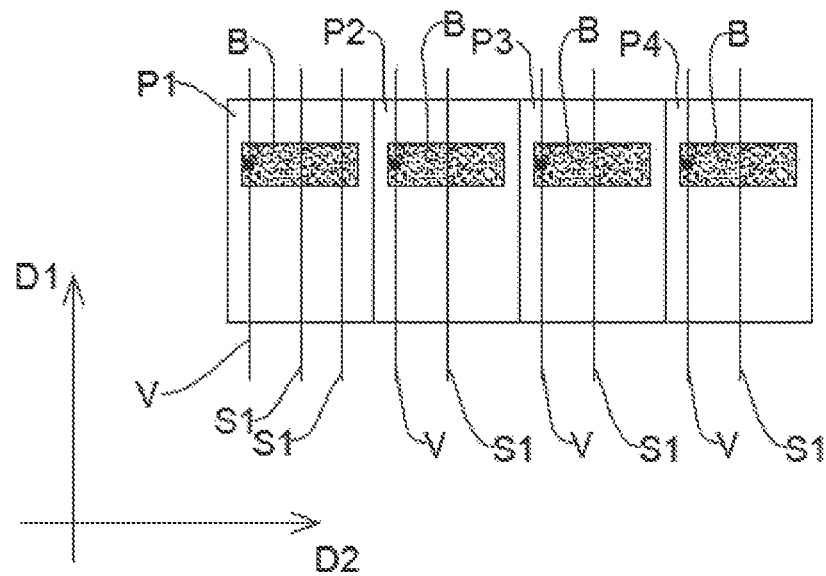
FIG. 9 is a schematic diagram of a fourth arrangement position of a shield trace according to the embodiment of the present application.
Figure 10:
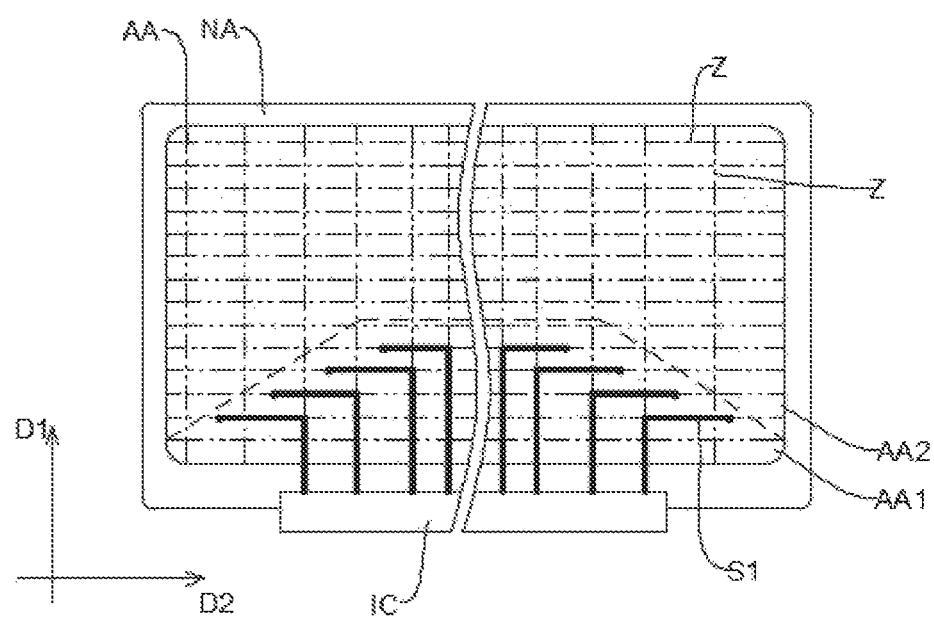
FIG. 10 is a schematic diagram of an arrangement position of a shelter trace in a display panel according to an embodiment of the present application.

In another embodiment, referring to FIGS. 8 and 9, a plurality of sub-pixels of the display panel include a first sub-pixel P1, a second sub-pixel P2, a third sub-pixel P3, and a fourth sub-pixel P4 arranged along a second direction D2. The number of drive traces S1 included in the first sub-pixel P1 extending in the first direction D1 is greater than the number of drive traces S1 included in the second sub-pixel P2, the third sub-pixel P3, and the fourth sub-pixel P4 extending in the first direction D1. For example, the number of drive traces S1 included in the first sub-pixel P1, the second sub-pixel P2, the third sub-pixel P3, and the fourth sub-pixel P4 is 2, 1, 1, and 1, respectively, and the distribution law repeatedly appear in the area in the display panel provided with the drive traces S1. For such an embodiment, the shield trace B may be disposed simultaneously in the first sub-pixel P1, the second sub-pixel P2, the third sub-pixel P3, and the fourth sub-pixel P4 (for example, as shown in FIG. 9) to achieve signal shielding for each sub-pixel provided with the drive trace S1. The shield traces B may be provided only in the first sub-pixel P1, and the second sub-pixel P2, the third sub-pixel P3, and the fourth sub-pixel P4 may not be provided with the shield traces B (for example, as shown in FIG. 8), so as to reduce the number of shield traces B, and perform signal shielding only in sub-pixels including a large number of drive traces S1, so as to balance the signal shielding effect and the display opening rate.

Next, the structural features of the shelter traces Z in the display panel provided in the embodiment of the present application will be described with reference to FIGS. 1, 5, and 10-13. It will be understood that, based on the above description, the metal film layer in which the shelter traces Z are located in the film layer structure of the display panel is the fourth metal layer, the fourth metal layer is located on a side of the second metal layer away from the shield layer, a plurality of the shelter traces Z are disposed in the fourth metal layer, and the shelter traces Z are disposed corresponding to the display area AA.

In an embodiment, referring to FIGS. 1, 5, and 10-13, the display area AA of the display panel includes a first display area AA1 provided with the drive traces S1, and a second display area AA2 adjacent to the first display area AA1. Therefore, the drive traces S1 are not provided in the second display area AA2. The shelter trace Z covers the first display area AA1 and the second display area AA2 at the same time, and a distribution shape of the shelter trace Z in the first display area AA1 is the same as a distribution shape of the shelter trace Z in the second display area AA2, and an orthographic projection of the drive trace S1 located in the first display area AA1 on the fourth metal layer overlaps with the shelter trace Z. It will be understood that a distribution shape of the shelter trace Z in the fourth metal layer is the same as a distribution shape of the drive trace S1 in the second metal layer, and the shelter trace Z extends the distribution shape of the drive trace S1 to the entire display area AA, thereby forming a uniform-shape-distribution shelter trace Z covering the entire display area AA on an upper layer of the drive trace S1.

It should be noted that when the drive traces S1 are disposed in the display area AA, and the drive traces S1 cannot completely and uniformly cover the entire display area AA. Therefore, the design may cause a defect of uneven metal traces density in the display area of the display panel, which may further cause a display stripe in the display panel, seriously affecting the display effect. In the present embodiment, the shelter traces Z are provided on the drive traces S1 in a uniform distribution, and the shelter traces Z are closer to a light-emitting side of the display panel than the drive traces S1. Therefore, the design of the present embodiment can alleviate the problem of display stripes caused by the drive traces S1 being provided in the display area AA.

Alternatively, the shelter trace Z may also be electrically connected to the constant voltage trace V. By applying a constant voltage to the shelter trace Z, it is possible to shield the signal of the drive trace S1 and prevent the signal of the drive trace S1 from interfering with the upper-layer trace or the electronic component thereof, for example, to prevent the signal of the drive trace S1 from interfering with the anode 302 in the light-emitting layer 30.

Figure 5:
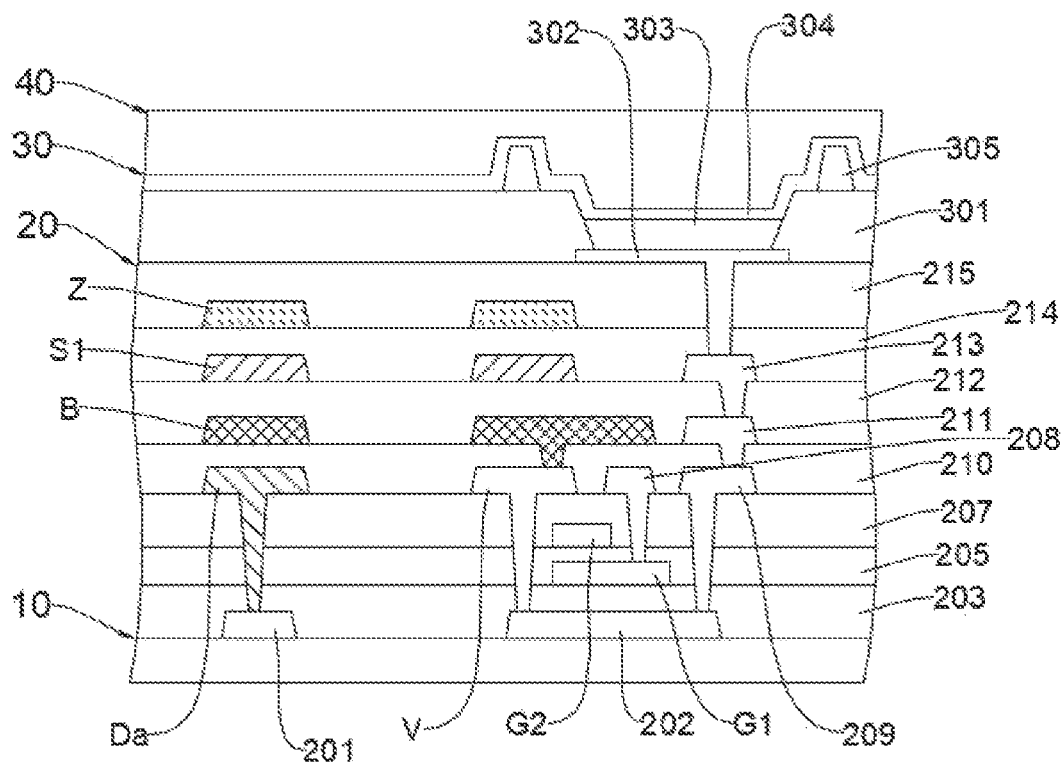
FIG. 5 is a schematic diagram of a film layer structure of a display panel according to an embodiment of the present application.
Figure 11:
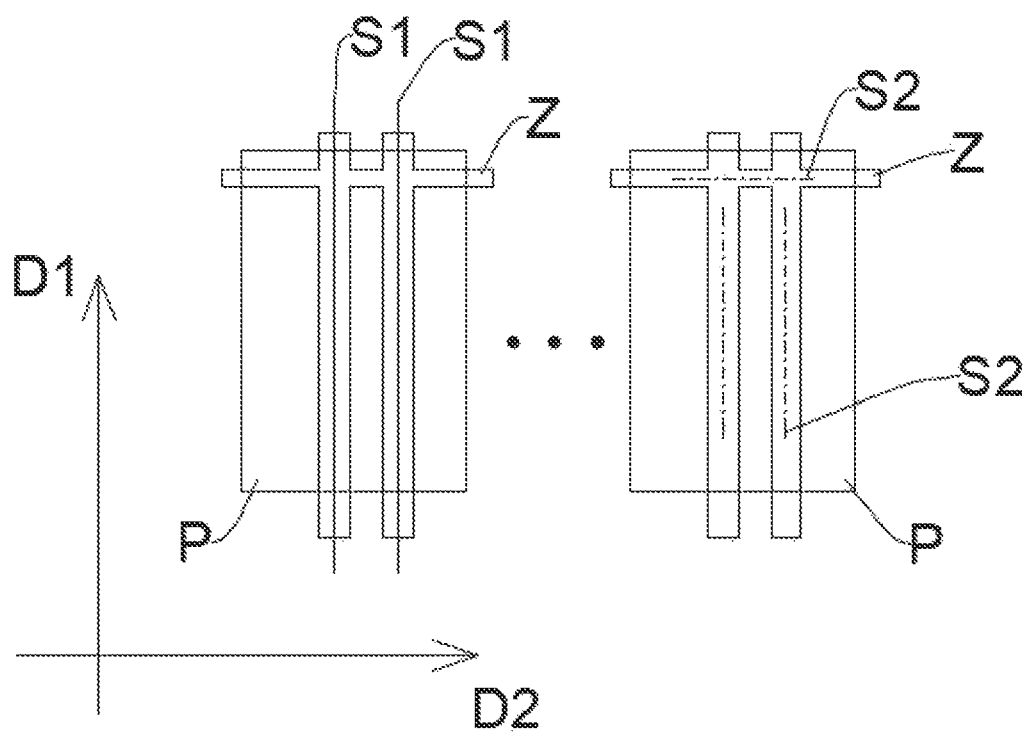
FIG. 11 is a schematic diagram of a first arrangement position of a shelter trace with respect to a sub-pixel in a display panel according to an embodiment of the present application.
Figure 12:
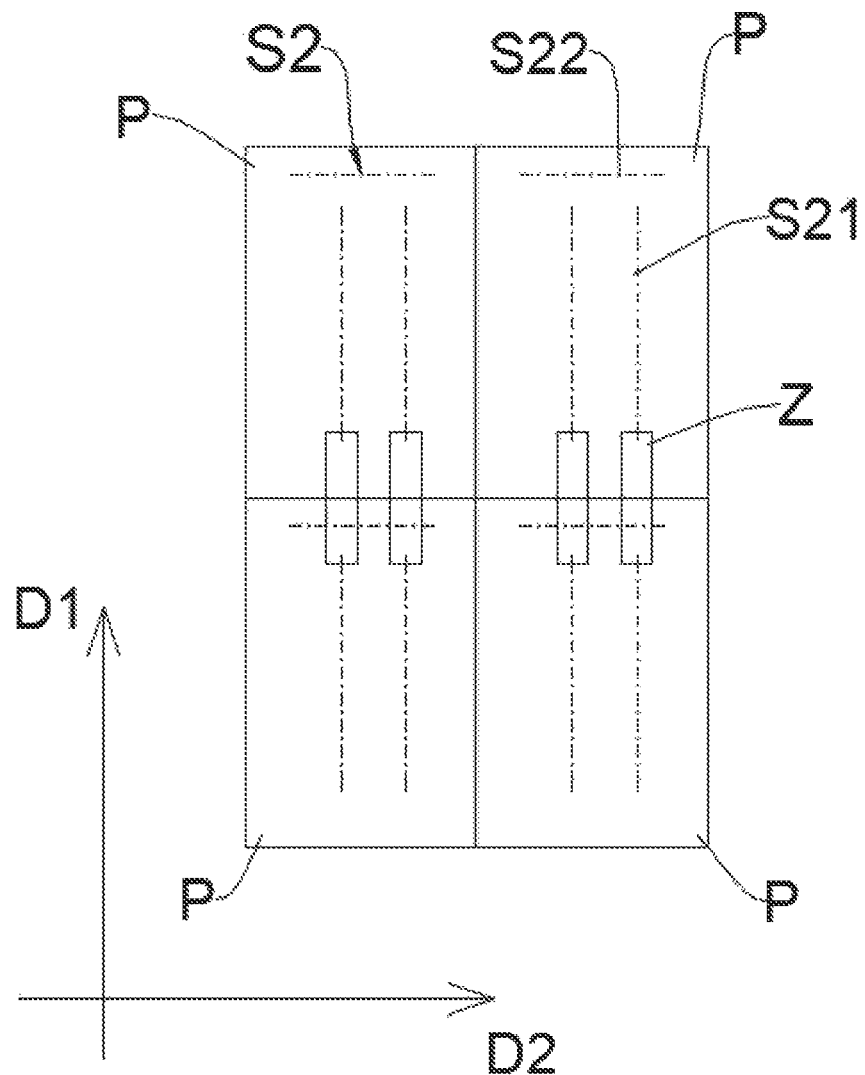
FIG. 12 is a schematic diagram of a second arrangement position of a shelter trace with respect to a sub-pixel in a display panel according to an embodiment of the present application.

In another embodiment, refer to FIGS. 1, 5, and 11, the shelter trace Z in the display panel has a same film position as in the above-described embodiment, and is also provided in the fourth metal layer on the side of the second metal layer away from the shield layer. The second metal layer is provided with a plurality of virtual traces S2 which are electrically insulated from the drive traces S1 and the drive chip IC in addition to the drive traces S1. The virtual trace S2 is used to alleviate the problem of uneven trace density due to the provision of the drive trace S1 in the display area AA. Therefore, the virtual trace S2 is provided in the display area AA where the drive trace S1 is not provided, and the virtual trace S2 can be provided in each of the display areas AA where the drive trace S1 is provided but the drive trace S1 is not uniformly distributed. And the virtual traces S2 maintain distribution positions and distribution numbers consistent with the drive traces S1 with respect to the respective sub-pixels P.

In this embodiment, the shelter traces Z are distributed throughout the display area AA, and an orthographic projection of the drive traces S1 on the fourth metal layer overlaps with the shelter traces Z, and an orthographic projection of the virtual traces S2 on the fourth metal layer overlaps with the shelter traces Z. The present embodiment further alleviates the display strips caused by the uneven distribution of the drive trace S1 in the display area AA by using the shelter trace Z.

In another embodiment, referring to FIGS. 1, 5, 12, and 13. In this embodiment, the film position of the shelter trace Z in the display panel is the same as that in the above-described embodiment, and the structural features of the virtual trace S2 and the relative position features relative to the drive trace S1 are the same as those in the above-described embodiment.

In the plurality of sub-pixels P of the display panel, the virtual traces S2 in two adjacent sub-pixels P are disconnected from each other, and an orthographic projection of the shelter traces Z on the second metal layer covers partially at least a disconnection region of the virtual traces S2 in two adjacent sub-pixels P. It can be understood that the disconnection region formed in the virtual traces S2 in the different sub-pixels P cause the distribution density of the virtual traces S2 in the entire display area AA to be uneven. In this embodiment, the disconnection regions are shielded by the shelter traces Z to a certain extent to compensate for the distribution unevenness of the virtual traces S2, thereby achieving the purpose of alleviating the display strip.

Specifically, the plurality of virtual traces S2 includes a first virtual trace S21 extending in the first direction D1 and a second virtual trace S22 extending in the second direction D2. The orthographic projection of the shelter trace Z on the second metal layer covers the disconnection region of the first virtual trace S21 in two adjacent sub-pixels P (for example, shown in FIG. 12).

Figure 13:
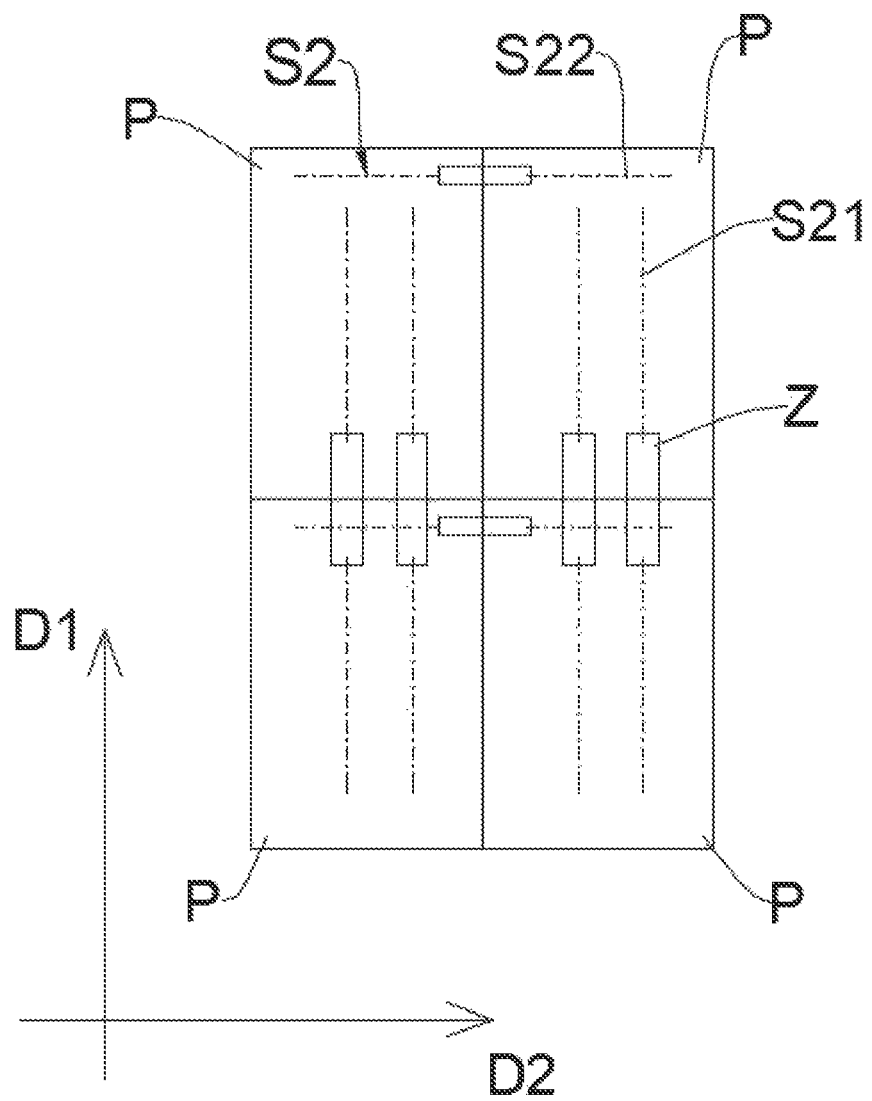
FIG. 13 is a schematic diagram of a third arrangement position of a shelter trace with respect to a sub-pixel in a display panel according to an embodiment of the present application.

Alternatively, the orthographic projection of the shelter trace Z on the second metal layer may also cover the disconnection region of the second virtual trace S22 in two adjacent sub-pixels P, and the disconnection region of the first virtual trace S21 in two adjacent sub-pixels P (for example, shown in FIG. 13).

In summary, in the display panel provided in the embodiment of the present application, the shield trace B is disposed between the drive trace S1 and the gate trace G, thereby shielding the signal between the drive trace S1 and the gate trace G, weakening or eliminating the interference of the signal in the drive trace S1 on the signal in the gate trace G, and improving the display quality of the display panel. Moreover, by providing the shelter trace Z on the side of the drive trace S1 facing the light-emitting side of the display panel, the drive trace S1 is shielded, and the display strip problem caused by the uneven distribution of the drive trace S1 in the display area AA is alleviated, and the display quality of the display panel is further improved.

It should be noted that, although the present application discloses the foregoing embodiments, the foregoing embodiments are not intended to limit the present application. A person of ordinary skill in the art may make various changes and finishes without departing from the spirit and scope of the present application. Therefore, the scope of protection of the present application is subject to the scope defined by the claims.

What is claimed is:

1. A display panel, comprising a display area and a non-display area adjacent to the display area, wherein the display panel comprises:
   a substrate;
   a drive circuit layer disposed on the substrate, wherein the drive circuit layer comprises: a plurality of data lines and a plurality of constant voltage traces located in the display area, and a plurality of drive traces located at least partially in the display area and electrically connected to the data lines and a drive chip;

wherein the drive circuit layer further comprises a first metal layer, a second metal layer, and a shield layer between the first metal layer and the second metal layer, the first metal layer comprises a plurality of gate traces, the shield layer comprises a plurality of shield traces electrically connected to the constant voltage traces, the second metal layer comprises the drive traces, and an overlap region of at least a portion of an orthographic projection of the drive trace on the shield layer and at least a portion of orthographic projection of the gate trace on the shield layer overlaps with the shield trace;

wherein the display panel further comprises a fourth metal layer located on a side of the second metal layer away from the shield layer, the fourth metal layer comprises a plurality of shelter traces located in the display area;

the second metal layer comprises a plurality of virtual traces electrically insulated from the drive traces and the drive chip, the display panel comprises a plurality of sub-pixels, the virtual traces in two adjacent sub-pixels are disconnected from each other, and an orthographic projection of the shelter trace on the second metal layer covers at least a portion of a disconnection region of the virtual traces in two adjacent sub-pixels.

2. The display panel according to claim 1, wherein an orthographic projection of at least a portion of the drive trace on the shield layer overlaps with the shield trace, and an orthographic projection of at least a portion of the gate trace on the shield layer overlaps with the shield trace.

3. The display panel according to claim 2, wherein the orthographic projection of the drive trace on the shield layer overlaps with the shield trace.

4. The display panel according to claim 1, wherein the display panel comprises a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel.

5. The display panel according to claim 1, wherein the display panel comprises a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel and the second sub-pixel.

6. The display panel according to claim 3, wherein the drive circuit layer further comprises a third metal layer disposed between the first metal layer and the shield layer, the third metal layer comprises the data line, the constant voltage trace, and a gate connection line electrically connected to the gate trace, the shield trace covers at least an overlap region of an orthographic projection of the data line, the constant voltage trace, and the gate connection line on the shield layer and the orthographic projection of the drive trace on the shield layer.

7. The display panel according to claim 1, wherein a connection point of the drive trace and the data line is located in the display area.

8. The display panel according to claim 7, wherein a number of connection points of each drive trace and the data line is one or more.

9. The display panel according to claim 7, wherein an end of the drive trace terminates at the connection point of the drive trace and the data line.

10. The display panel according to claim 1, wherein the display area comprises a first display area provided with the drive trace and a second display area adjacent to the first display area;

a distribution shape of the shelter traces in the first display area is the same as a distribution shape of the shelter traces in the second display area, and an orthographic projection of the drive trace in the display area on the fourth metal layer overlaps with the shelter trace.

11. The display panel according to claim 10, wherein a distribution shape of a layout of the shelter traces in the fourth metal layer is the same as a distribution shape of the drive traces in the second metal layer.

12. The display panel according to claim 10, wherein the shelter trace is closer to a light-emitting side of the display panel than the drive trace.

13. The display panel according to claim 1, wherein the plurality of the virtual traces comprise a first virtual trace extending in a first direction and a second virtual trace extending in a second direction;

an orthographic projection of the shelter trace on the second metal layer covers a disconnection region of the first virtual traces in two adjacent sub-pixels.

14. The display panel according to claim 13, wherein the orthographic projection of the shelter trace on the second metal layer covers a disconnection region of the second virtual traces in two adjacent sub-pixels.

15. The display panel according to claim 1, wherein an orthographic projection of the drive trace on the fourth metal layer overlaps with the shield trace, and an orthographic projection of the virtual trace on the fourth metal layer overlaps with the shield trace.

16. The display panel according to claim 1, wherein the display area comprises a first display area provided with the drive trace, and a second display area adjacent to the first display area; a distribution shape of the shelter trace in the first display area is the same as a distribution shape of the shelter trace in the second display area.

17. The display panel according to claim 10, wherein the shelter trace is electrically connected to the constant voltage trace.

18. The display panel according to claim 1, wherein the shelter trace is electrically connected to the constant voltage trace.

19. A display panel, comprising a display area and a non-display area adjacent to the display area, wherein the display panel comprises:

a substrate;

a drive circuit layer disposed on the substrate, wherein the drive circuit layer comprises a plurality of data lines and a plurality of constant voltage traces located in the display area, and a plurality of drive traces located at least partially in the display area and electrically connected to the data lines and a drive chip;

wherein the drive circuit layer further comprises a first metal layer, a second metal layer, and a shield layer between the first metal layer and the second metal layer, the first metal layer comprises a plurality of gate traces, the shield layer comprises a plurality of shield traces electrically connected to the constant voltage traces, the second metal layer comprises the drive traces;

the display panel comprises a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel, and an orthographic projection of the drive trace on the shield layer overlaps with the shield trace.

20. A display panel, comprising a display area and a non-display area adjacent to the display area, wherein the display panel comprises:
   a substrate;
   a drive circuit layer disposed on the substrate, wherein the drive circuit layer comprises: a plurality of data lines and a plurality of constant voltage traces located in the display area, and a plurality of drive traces located at least partially in the display area and electrically connected to the data lines and a drive chip;
   wherein the drive circuit layer further comprises a first metal layer, a second metal layer, and a shield layer between the first metal layer and the second metal layer, the first metal layer comprises a plurality of gate traces, the shield layer comprises a plurality of shield traces electrically connected to the constant voltage traces, the second metal layer comprises the drive traces, and an overlap region of at least a portion of an orthographic projection of the drive trace on the shield layer and at least a portion of orthographic projection of the gate trace on the shield layer overlaps with the shield trace;
   wherein the display panel comprises a first sub-pixel and a second sub-pixel arranged in a second direction, a number of the drive traces included in the first sub-pixel extending in the first direction is greater than a number of the drive traces included in the second sub-pixel extending in the first direction, and the shield trace is disposed in the first sub-pixel and the second sub-pixel.

* * * * *